(12) United States Patent
Argento et al.

(10) Patent No.: US 11,719,761 B2
(45) Date of Patent: Aug. 8, 2023

(54) CAPACITOR MEASUREMENT

(71) Applicant: STMicroelectronics S.r.l., Agrate Brianza (IT)

(72) Inventors: Davide Argento, Milan (IT); Orazio Pennisi, Pieve Emanuele (IT); Stefano Castorina, Milan (IT); Vanni Poletto, Milan (IT); Matteo Landini, Bareggio (IT); Andrea Maino, Novara (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/407,747

(22) Filed: Aug. 20, 2021

(65) Prior Publication Data

US 2023/0055745 A1 Feb. 23, 2023

(51) Int. Cl.
*G01R 31/64* (2020.01)
*G01R 27/26* (2006.01)
*G01R 31/00* (2006.01)

(52) U.S. Cl.
CPC ......... *G01R 31/64* (2020.01); *G01R 27/2605* (2013.01); *G01R 31/006* (2013.01)

(58) Field of Classification Search
CPC .. G01R 31/64; G01R 27/2605; G01R 31/006; G01R 27/14; G01R 31/016; G01R 27/26; G01R 31/36; G01R 31/389; B60R 2021/0115; B60R 2021/01163; B60R 2021/01184; B60R 21/0173
See application file for complete search history.

(56) References Cited

U.S. PATENT DOCUMENTS

| | | |
|---|---|---|
| 4,243,933 A | 1/1981 | Rollman |
| 6,580,279 B1 | 6/2003 | Baumgartner et al. |
| 6,806,716 B2 | 10/2004 | Bertness et al. |

(Continued)

FOREIGN PATENT DOCUMENTS

| | | |
|---|---|---|
| DE | 10319336 A1 | 11/2004 |
| EP | 0732793 A1 | 9/1996 |

(Continued)

OTHER PUBLICATIONS

Translation : Description JP2000219097A, Espacenet.com Accessed Oct. 14, 2022 (Year: 2022).*

(Continued)

*Primary Examiner* — Tung S Lau
(74) *Attorney, Agent, or Firm* — Slater Matsil, LLP

(57) ABSTRACT

A system and method for measuring a capacitance value of a capacitor are provided. In embodiments, a resistor is coupled to a terminal of the capacitor. A difference in voltage at the terminal between a first time and a second time during a discharge routine of the capacitor is measured. The discharge routine includes sinking a current through a discharge circuit coupled to the resistor from first to second. Integration of a difference in voltage at terminals of the resistor during the discharge routine between the first and second times is also measured. The capacitance value is computed based on the measured difference in voltage, the measured integration, and the resistance value of the resistor. The health of the capacitor is determined based on a difference between the computed capacitance value and a threshold value.

20 Claims, 5 Drawing Sheets

(56) References Cited

U.S. PATENT DOCUMENTS

| | | | |
|---|---|---|---|
| 7,155,353 B2 | 12/2006 | Okamoto et al. | |
| 7,324,902 B2 * | 1/2008 | Verbrugge | G01R 31/3828 702/64 |
| 7,477,038 B2 | 1/2009 | Taniguchi | |
| 8,892,198 B2 * | 11/2014 | Bohorquez | A61B 5/0537 600/547 |
| 8,988,084 B2 | 3/2015 | Schumacher et al. | |
| 2004/0162683 A1 * | 8/2004 | Verbrugge | G01R 31/367 702/64 |
| 2005/0169018 A1 | 8/2005 | Hatai et al. | |
| 2007/0030016 A1 | 2/2007 | Schumacher et al. | |
| 2007/0252633 A1 * | 11/2007 | Frankel | G01D 1/10 374/107 |
| 2009/0121725 A1 | 5/2009 | Hashimoto | |
| 2009/0160459 A1 | 6/2009 | De Langen et al. | |
| 2009/0206854 A1 | 8/2009 | Bernardon et al. | |
| 2010/0177538 A1 * | 7/2010 | Scherr | G01R 31/28 363/39 |
| 2011/0125224 A1 | 5/2011 | Carbunaru et al. | |
| 2011/0133757 A1 * | 6/2011 | Chae | G01R 31/64 324/678 |
| 2012/0068765 A1 | 3/2012 | Leonardo | |
| 2015/0222256 A1 | 8/2015 | Sasai | |
| 2015/0260800 A1 * | 9/2015 | Baba | G01R 31/3648 702/63 |
| 2016/0131720 A1 * | 5/2016 | Baba | G01R 31/367 702/63 |
| 2016/0274172 A1 | 9/2016 | Yoshida | |
| 2017/0336463 A1 * | 11/2017 | Makdessi | H02M 5/458 |
| 2020/0060574 A1 * | 2/2020 | Lupton | A61B 5/684 |
| 2021/0173419 A1 | 6/2021 | Severson et al. | |
| 2022/0043070 A1 * | 2/2022 | Mallett | H02H 7/04 |

FOREIGN PATENT DOCUMENTS

| | | | |
|---|---|---|---|
| EP | 1622795 A1 | | 2/2006 |
| JP | H08336233 A | | 12/1996 |
| JP | 2000219097 A | * | 8/2000 |

OTHER PUBLICATIONS

STMicroelectronics, "Automotive advanced airbag ID for mid/high end applications," L9680, DS11615 Rev 2, Oct. 2018, Datasheet—production data, 280 pages.

* cited by examiner

CAPACITOR MEASUREMENT

TECHNICAL FIELD

The present disclosure generally relates to electronic technology and, in particular embodiments, to systems, methods, and devices for measuring a capacitor.

CROSS-REFERENCE TO RELATED APPLICATIONS

This application is related to co-pending U.S. patent application Ser. No. 17/407,725, filed on the same day as this application, entitled "Measuring a Change in Voltage," which application is hereby incorporated by reference herein in its entirety.

BACKGROUND

Modern vehicles are typically equipped with airbags, commonly referred to as a supplemental inflatable restraint system (SIR) or a supplemental restraint system (SRS). These systems are secondary to the vehicle's seat belt restraint system and used further to protect passengers in the event of a crash. A deployment circuit, which typically includes a microcontroller and an accelerometer, actuates a firing circuit of the supplemental restraint system during a collision. The firing circuit fires a squib upon command of the microcontroller, which deploys the vehicle's airbags.

A dependable electrical energy source for the reliable operation of the system is essential. Typically, the vehicle ignition voltage provides power to the system through the vehicle's primary battery. However, in some instances, during a collision, the vehicle's primary battery can become disconnected or inaccessible to the supplemental restraint system. A known solution is to provide a reserve capacitor (i.e., energy reserve source) connected to the system—the reserve capacitor provides power when the vehicle's primary battery becomes unreachable. A reliable system to monitor the operation of the reserve capacitor is desirable.

SUMMARY

Technical advantages are generally achieved by embodiments of this disclosure which describe systems, methods, and devices for measuring a capacitor.

A first aspect relates to a method for measuring a capacitance value of a capacitor; the method includes having a resistor coupled to a terminal of the capacitor; measuring a difference in voltage at the terminal between a first time and a second time during a discharge routine of the capacitor, the discharge routine includes sinking a current through a discharge circuit coupled to the resistor from the first time to the second time; measuring an integration of a difference in voltage at terminals of the resistor during the discharge routine between the first time and the second time; computing the capacitance value based on the measured difference in voltage, the measured integration, and a resistance value of the resistor; and determining a health of the capacitor based on a difference between the computed capacitance value and a threshold value.

In a first implementation form of the method according to the first aspect as such, the method further includes determining the second time by monitoring the voltage at the terminal during the discharge routine, the second time corresponding to a difference in voltage at the terminal, between the first time and the second time, being greater than or equal to a second threshold voltage.

In a second implementation form of the method according to the first aspect as such or any preceding implementation form of the first aspect, a value of the second threshold voltage is 1.2 volts, and a steady-state voltage at the capacitor is between 20 and 33 volts.

In a third implementation form of the method according to the first aspect as such or any preceding implementation form of the first aspect, the capacitor is a reserve capacitor in a supplemental restraint system of a vehicle.

In a fourth implementation form of the method according to the first aspect as such or any preceding implementation form of the first aspect, the capacitance value is computed using the equation:

$$C_{ER} = \frac{\int_{t_1}^{t_2}[V_{ER}(t) - V_{DCH}(t)]dt}{V_{START} - V_{STOP}} \times \frac{1}{R_{DCH}},$$

where $R_{DCH}$ is the resistance value of the resistor, $V_{ER}$ is the voltage at the terminal, $V_{DCH}$ is a voltage at a second terminal of the resistor coupled to the discharge circuit, $t_1$ is the first time, $t_2$ is the second time, $V_{start}$ is a steady-voltage at the terminal before the discharge circuit is enabled, and $V_{stop}$ is a voltage at the terminal after the discharge circuit is disabled.

A second aspect relates to a method for measuring an equivalent series resistor value of a capacitor; the method includes having a resistor coupled to a terminal of the capacitor; measuring a first change in voltage at the terminal at a first time during a discharge routine, the discharge routine includes sinking a current through a discharge circuit coupled to the resistor from the first time to a second time; measuring a first change in voltage across terminals of the resistor at the first time; measuring a second change in voltage across the terminals of the resistor at the second time; measuring a second change in voltage at the terminal at the second time; computing the equivalent series resistor value based on the measurements; and determining a health of the capacitor based on a difference between the computed equivalent series resistor value and a threshold value.

In a first implementation form of the method according to the second aspect as such, the method further includes determining the second time by monitoring the voltage at the terminal during the discharge routine, the second time corresponding to a change in voltage at the terminal, between the first time and the second time, being greater than or equal to a second threshold voltage.

In a second implementation form of the method according to the second aspect as such or any preceding implementation form of the second aspect, a value of the second threshold voltage is 1.2 volts, and a steady-state voltage at the capacitor is between 20 and 33 volts.

In a third implementation form of the method according to the second aspect as such or any preceding implementation form of the second aspect, the equivalent series resistor value is computed using the equation:

$$ESR = R_{DCH} \times \frac{\Delta V_{START} + \Delta V_{STOP}}{[V_{ER}(t_1) - V_{DCH}(t_1)] + [V_{ER}(t_2) - V_{DCH}(t_2)]},$$

wherein $R_{DCH}$ is a resistance value of the resistor, $V_{ER}$ is the voltage at the terminal shared with a first terminal of the resistor, $V_{DCH}$ is a voltage at a second terminal of the resistor coupled to the discharge circuit, $t_1$ is the first time, $t_2$ is the second time, $\Delta V_{START}$ is the first change in voltage at the terminal, and $\Delta V_{STOP}$ is the second change in voltage at the terminal.

In a fourth implementation form of the method according to the second aspect as such or any preceding implementation form of the second aspect, measuring the first change in voltage at the terminal includes measuring a change in voltage at the terminal between a steady-state condition and a third time, where the steady-state condition corresponds to a time before enabling of the discharge circuit at the first time, and wherein the third time is a time corresponding to a first change in slope of the voltage at the terminal during the discharge routine.

In a fifth implementation form of the method according to the second aspect as such or any preceding implementation form of the second aspect, measuring the second change in voltage at the terminal includes measuring a change in voltage at the terminal during a third time and a fourth time, the third time is a time corresponding to a second change in slope of the voltage at the terminal during the discharge routine, and the fourth time is a time corresponding to a third change in slope of the voltage at the terminal, the third change in slope being after the discharge circuit is disabled.

A third aspect relates to a system for measuring a voltage drop of a reserve capacitor in a supplemental restraint system (SRS), the reserve capacitor having a capacitance value and an equivalent series resistor value, the system includes a resistor having a first terminal and a second terminal, the first terminal of the resistor coupled to a terminal of the reserve capacitor; a discharge circuit coupled to the second terminal of the resistor, the discharge circuit configured to supply a discharge path for the reserve capacitor during a discharge routine; and circuitry configured to measure a first change in voltage at the first terminal between a first time and a second time during a discharge routine of the reserve capacitor, the discharge routine includes sinking a current through a discharge circuit coupled to the resistor from the first time to the second time, measuring an integration of a first change in voltage at the terminals of the resistor during the discharge routine between the first time and the second time, measuring a second change in voltage at the first terminal at the first time, measuring a first change in voltage across terminals of the resistor at the first time, measuring a second change in voltage across the terminals of the resistor at the second time, and measuring a third change in voltage at the first terminal at the second time.

In a first implementation form of the system according to the third aspect as such, the system further includes a logic circuit configured to compute the capacitance value based on the measured first change in voltage at the first terminal and the measured integration; and determine the health of the reserve capacitor based on a difference between the computed capacitance value and a threshold value.

In a second implementation form of the system according to the third aspect as such or any preceding implementation form of the third aspect, the capacitance value is computed using the equation:

$$C_{ER} = \frac{\int_{t_1}^{t_2} [V_{ER}(t) - V_{DCH}(t)]dt}{V_{START} - V_{STOP}} \times \frac{1}{R_{DCH}},$$

where $R_{DCH}$ is a resistance value of the resistor, $V_{ER}$ is the voltage at the terminal, $V_{DCH}$ is a voltage at a second terminal of the resistor coupled to the discharge circuit, $t_1$ is the first time, $t_2$ is the second time, $V_{start}$ is a steady-voltage at the terminal before the discharge circuit is enabled, and $V_{stop}$ is a voltage at the terminal after the discharge circuit is disabled.

In a second implementation form of the system according to the third aspect as such or any preceding implementation form of the third aspect, the system further includes a logic circuit configured to compute the equivalent series resistor value based on the measured second and third change in voltage at the first terminal and the first and second change in voltage across terminals of the resistor; and determine health of the reserve capacitor based on a difference between the computed equivalent series resistor value and a threshold value.

In a third implementation form of the system according to the third aspect as such or any preceding implementation form of the third aspect, the equivalent series resistor value is computed using the equation:

$$ESR = R_{DCH} \times \frac{\Delta V_{START} + \Delta V_{STOP}}{[V_{ER}(t_1) - V_{DCH}(t_1)] + [V_{ER}(t_2) - V_{DCH}(t_2)]},$$

where $R_{DCH}$ is a resistance value of the resistor, $V_{ER}$ is a voltage at the first terminal, $V_{DCH}$ is a voltage at the second terminal, $t_1$ is the first time, $t_2$ is the second time, $\Delta V_{START}$ is the second change in voltage at the first terminal, and $\Delta V_{STOP}$ is the third change in voltage at the first terminal.

In a fourth implementation form of the system according to the third aspect as such or any preceding implementation form of the third aspect, the second time corresponds to a difference in voltage at the first terminal, between the first time and the second time, being greater than or equal to a second threshold voltage.

In a fifth implementation form of the system according to the third aspect as such or any preceding implementation form of the third aspect, a value of the second threshold voltage is 1.2 volts, and a steady-state voltage at the reserve capacitor is between 20 and 33 volts.

In a sixth implementation form of the system according to the third aspect as such or any preceding implementation form of the third aspect, measuring the second change in voltage at the first terminal includes measuring a change in voltage at the first terminal during a steady-state condition and a third time, the steady-state condition corresponds to a time before enabling of the discharge circuit at the first time, and the third time is a time corresponding to a first change in slope of the voltage at the terminal during the discharge routine.

In a seventh implementation form of the system according to the third aspect as such or any preceding implementation form of the third aspect, measuring the third change in voltage at the first terminal at the second time includes measuring a difference in voltage at the first terminal during a third time and a fourth time, the third time is a time corresponding to a second change in slope of the voltage at the terminal during the discharge routine, and the fourth time is a time corresponding to a third change in slope of the voltage at the terminal, the third change in slope being after the discharge circuit is disabled.

Embodiments can be implemented in hardware, software, or in any combination thereof.

BRIEF DESCRIPTION OF THE DRAWINGS

For a more complete understanding of the present disclosure and the advantages thereof, reference is now made to the following descriptions taken in conjunction with the accompanying drawings, in which.

DETAILED DESCRIPTION OF ILLUSTRATIVE EMBODIMENTS

Figure 1A:
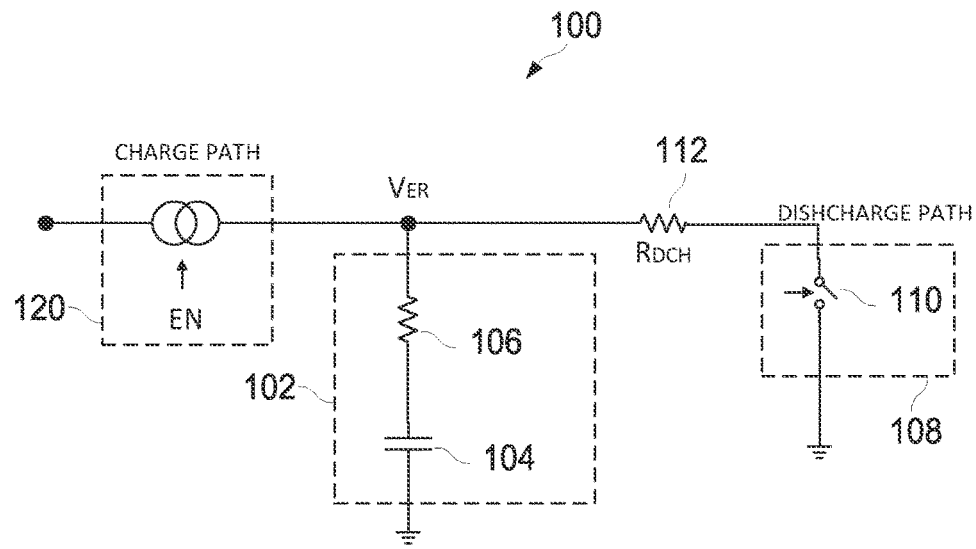
FIG. 1a is a circuit model of an embodiment reserve capacitor.

This disclosure provides many applicable inventive concepts that can be embodied in a wide variety of specific contexts. The particular embodiments are merely illustrative of specific configurations and do not limit the scope of the claimed embodiments. Features from different embodiments may be combined to form further embodiments unless noted otherwise.

Variations or modifications described to one of the embodiments may also apply to other embodiments. Further, it should be understood that various changes, substitutions, and alterations can be made herein without departing from the spirit and scope of this disclosure as defined by the appended claims.

While inventive aspects are described primarily in the context of a reserve capacitor of a supplemental restraint system (SRS), the inventive aspects may be similarly applicable to any electronic device that can benefit from a measurement of a capacitor of the electronic device. Such devices can profit from the measurement of a voltage drop over an unknown voltage baseline to determine the proper functioning of the capacitor.

Generally, a vehicle's supplemental restraint system includes one or more reserve capacitors that provide an alternative energy source for the system if the primary energy source (e.g., vehicle's primary battery) becomes disabled or inaccessible. During regular operation, a charging circuit charges the reserve capacitor through, for example, the vehicle's primary battery. Typically, the reserve capacitor is isolated from the deployment circuit to minimize the load on the charging circuit. In the event of a crash and the absence of the primary energy source, an isolation circuit detects vehicle ignition voltage loss and connects the reserve capacitor to the deployment circuit for the continued operation of the supplemental restraint system.

An airbag control module of the supplemental restraint system cyclically evaluates for hardware failures and communicates any errors with the vehicle's diagnostic computer through a diagnostic trouble code (DTC). In response, the vehicle's dash panel displays errors through, for example, a flashing airbag warning light to the user.

Embodiments of this disclosure can be used to determine the capacitance of the reserve capacitor and its equivalent series resistor (ESR). Once the capacitance and equivalent series resistor values are computed, the health of the reserve capacitor can be determined. A diagnostic trouble code (DTC) is generated if the reserve capacitor is determined to be faulty based on the computation. The diagnostic trouble code generates a warning signal that alerts the vehicle owner of the supplemental restraint system issues.

Embodiments of this disclosure provide an application-specific integrated or standalone circuit used in combination with a circuit implemented in a standard supplemental restraint system. In combination, the circuits provide various functions, such as power management, deployment functionality for drivers (e.g., supporting both squib and low-energy actuator loads), deployment functionality for regulators, remote sensor interfaces (e.g., supporting Peripheral Sensor Interface 5 ($PSI_5$) satellite sensors), diagnostic functionality, deployment arming, hall-effect sensor interfaces, switch sensor interfaces, general-purpose low-side drivers, watchdog functionality, local internet network (LIN) interface, and the like.

Aspects of this disclosure include an improved technique over existing circuits. In embodiments, the systems and methods disclosed herein improve the measurement accuracy, minimize dissipation associated with measurements, and minimize component count used to make measurements. In particular embodiments, the measurement techniques provide an improved system and method to measure the health of a reserve capacitor used in a supplemental restraint system.

In an embodiment, a discharge resistor is coupled to a terminal of the reserve capacitor to dissipate power during a discharge phase of the circuit. A switch is arranged in series between the reserve capacitor and the discharge resistor, which is activated and deactivated in response to a control signal associated with the discharge phase.

In an embodiment, during a single discharge routine from time $t_1$ to time $t_2$, a difference in voltage at the terminal of the reserve capacitor between time $t_1$ and time $t_2$ is measured. The discharge routine includes sinking a current through the discharge resistor from time $t_1$ to time $t_2$. During the same discharge routine phase, an integration of a difference in voltage at terminals of the discharge resistor is measured. Once the difference in voltage and the integration values are measured, because the resistance value of the discharge resistor is known, a logic circuit can compute the capacitance value of the reserve capacitor. Based on the difference between the computed capacitance value and a threshold value, the health of the reserve capacitor can be determined.

In another embodiment, during a single discharge routine, a discharge resistor is coupled to a terminal of the reserve capacitor. A difference in voltage at the terminal of the reserve capacitor during time $t_1$ and a second difference in voltage at the terminal of the reserve capacitor during time $t_2$ is measured. A difference in voltage across terminals of the discharge resistor at time $t_1$ is measured. The discharge routine includes sinking a current through a discharge circuit coupled to the discharge resistor from time $t_1$ to time $t_2$. At time $t_2$, a second difference in voltage across the terminals of the discharge resistor is measured. Once the various parameters are measured, the equivalent series resistor value of the reserve capacitor is computed. Based on the difference between the computed equivalent series resistor value and a threshold value, the health of the reserve capacitor can be determined.

In such an embodiment, the difference in voltage at the terminal of the reserve capacitor during time $t_1$ corresponds to a sharp voltage drop at the terminal from about 64 microseconds before time $t_1$ and approximately 64 microseconds after time $t_1$. Further, the difference in voltage at the terminal during time $t_2$ corresponds to a sharp voltage jump at the terminal from about 64 microseconds before time $t_2$ and about 64 microseconds after time $t_2$. Time $t_1$ corresponds to the time at which the discharge circuit coupled to the reserve capacitor is enabled. Time $t_2$ corresponds to the time at which the discharge circuit is disabled.

In an embodiment, the difference in voltage at the terminal of the reserve capacitor during time $t_1$ is a difference between the steady-state voltage and a voltage corresponding to a first change in slope of the voltage at the reserve capacitor after time $t_1$. Thus, the difference in voltage is a difference between the steady-state voltage value before the discharge circuit is enabled and the voltage immediately before the first change in slope of the voltage after the discharge circuit is enabled.

In an embodiment, the difference in voltage at the terminal during time $t_2$ is a difference in voltage at the terminal of the reserve capacitor immediately before a second change in slope and the voltage immediately before a third change in slope. The second change in slope being caused by the disabling of the discharge circuit.

It is noted that in embodiments, the health of the reserve capacitor can be determined based on more than one relationship between the computed measurements. Thus the determination of the health of the reserve capacitor is not limited to a one-to-one relationship between the computed values and an expected capacitance or equivalent series resistor value. For example, the health of the reserve capacitor can be determined by a complex relationship between the measured values, expected values, with various possible ranges corresponding to the manufacturing type, tolerances, operating ranges of the reserve capacitor, or the like.

In embodiments, the computation is at the system level, external to the circuit. At the system level, analysis of the capacitor's health can be based on a relationship between the capacitance value and the equivalent series resistor of the capacitor. In an exemplary circuit, having a reserve capacitor of 2.2 microfarads with an accuracy of 30%, a microcontroller or processor at the system level can determine that the value of the reserve capacitor is outside of the expected range and set a flag accordingly.

In embodiments, the various parameters are measured during a single discharge routine to minimize the total power dissipation used to compute the capacitance and equivalent series resistor (ESR) values. These and other details are discussed in greater detail below.

FIG. 1a illustrates a circuit model 100 of an embodiment reserve capacitor 102, which in addition to the model capacitor 104, includes an equivalent series resistor 106. In embodiments, the reserve capacitor 102 is an auxiliary source used to power a vehicle's supplemental restraint system as an alternative power source to the primary vehicle battery.

It is desirable to periodically monitor the reserve capacitor 102 for proper operation. At set intervals, the equivalent series resistor and capacitance values of reserve capacitor 102 are measured during a discharge routine of reserve capacitor 102 through the discharge circuit 108. Discharge circuit 108 provides a controllable (e.g., serial peripheral interface (SPI), etc.), low-ohmic path that allows reserve capacitor 102 to discharge during a discharge routine of reserve capacitor 102.

A charge circuit 120 is coupled to reserve capacitor 102. The charge circuit 120 provides a controllable (e.g., serial peripheral interface (SPI), etc.), low-ohmic path that, when enabled, allows reserve capacitor 102 to charge during a charge routine of reserve capacitor 102.

Discharge circuit 108 includes a discharge switch 110. A discharge resistor 112 is coupled to discharge circuit 108. When discharge switch 110 is activated, for example, during a discharge routine, current is dissipated through discharge resistor 112. The arrangement of components shown in FIG. 1a may (or may not) be arranged as shown. Further, discharge circuit 108 may include additional or fewer components as shown with the purpose of having a discharge path being provided for reserve capacitor 102 when discharge switch 110 is in the closed position.

In embodiments, discharge switch 110 is a metal-oxide-semiconductor field-effect transistor (MOSFET). Optionally, discharge circuit 108 may include a diode in series between discharge switch 110 and discharge resistor 112. Although, as shown, discharge circuit 108 is arranged between discharge resistor 112 and a reference voltage, in embodiments, the discharge resistor 112 is coupled in series between discharge switch 110 and a reference voltage.

In embodiments, discharge resistor 112 is located away from the circuit model 100 to minimize power dissipation and reduce circuit temperature during a discharge phase. In embodiments, discharge resistor 112 is advantageously utilized as a sensing resistor during the discharge phase of the circuit.

Figure 1B:
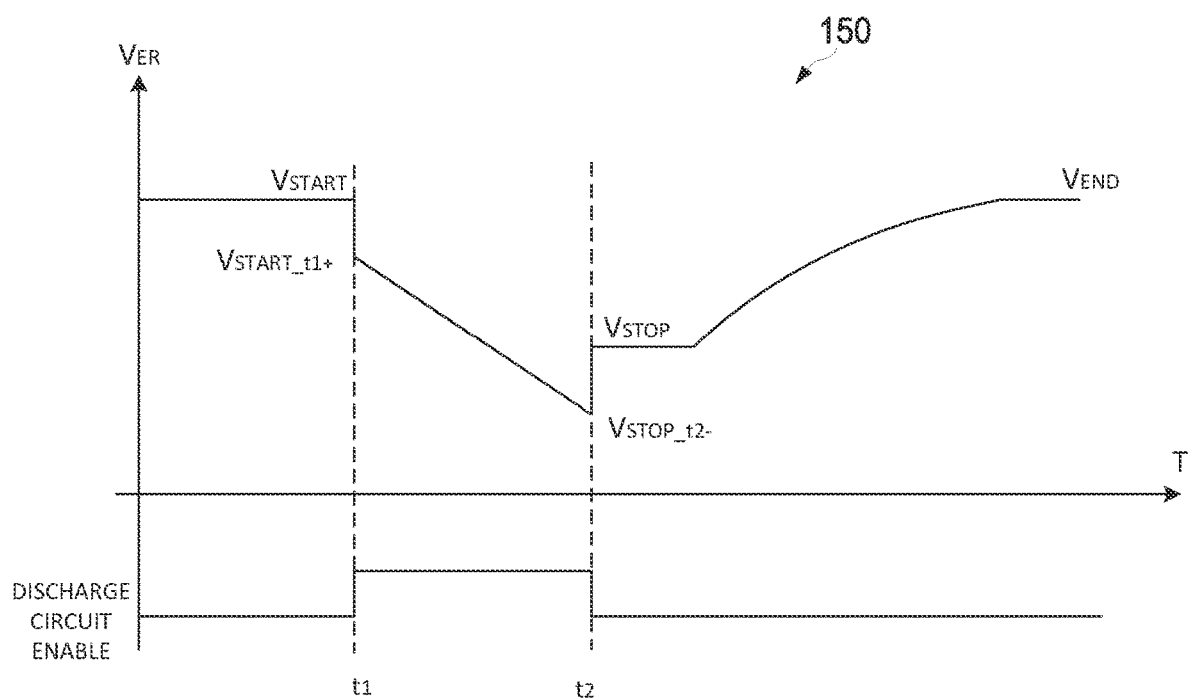
FIG. 1b is a timing diagram for a voltage discharge during a discharge routine.

FIG. 1b illustrates a timing diagram 150 for the $V_{ER}$ voltage at the terminal of the reserve capacitor 102 during a discharge routine. Before time $t_1$, discharge circuit 108 is disabled, and the $V_{ER}$ voltage corresponds to the steady-state voltage value $V_{START}$.

At time $t_1$, discharge circuit 108 is enabled through discharge switch 110. In response, reserve capacitor 102 is immediately discharged to a voltage value $V_{START\_t1+}$. The sharp drop in voltage at time $t_1$ generally corresponds to the non-zero equivalent series resistor value of reserve capacitor 102.

From time $t_1$ until time $t_2$, while discharge circuit 108 remains enabled, reserve capacitor 102 is constantly discharged until it reaches a voltage value $V_{STOP\_t2-}$.

At time $t_2$, discharge circuit 108 is disabled, and charge circuit 120 is enabled. In response, reserve capacitor 102 is immediately charged to an initial voltage value $V_{STOP}$. Gradually thereafter, reserve capacitor 102 is recharged to the steady-state voltage value $V_{END}$.

In embodiments, the voltage of the fully charged reserve capacitor 102 is between 20 and 33 Volts (V). In such an embodiment, the voltage drop between time $t_1$ and $t_2$ is approximately 600 millivolts (mV).

Figure 2:
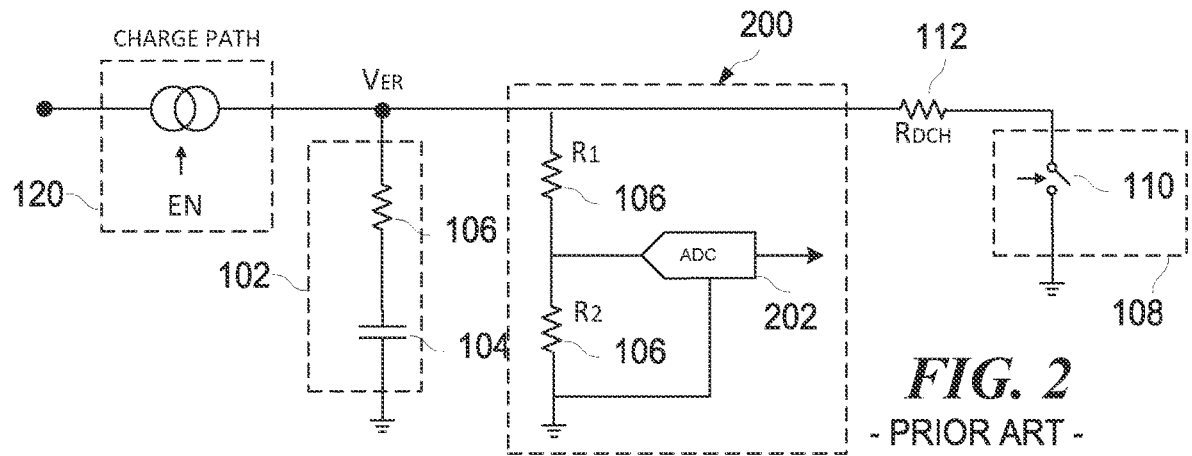
FIG. 2 is a prior art circuit used to measure a capacitance of a capacitor.

FIG. 2 illustrates a prior art circuit 200 used to measure the capacitance of reserve capacitor 102. Circuit 200 includes an analog-to-digital converter (ADC) 202, discharge circuit 108, $R_1$ resistor 204a, and $R_2$ resistor 204b.

The arrangement of $R_1$ and $R_2$ resistors 204a-b provides a resistor divider at the input of analog-to-digital converter 202. At time $t_1$ and $t_2$, the ratioed $V_{ER}$ voltage is converted to a digital value using analog-to-digital converter 202. The capacitance value ($C_{ER}$) of reserve capacitor 102 can, thus, be computed using the equation:

$$C_{ER} = \frac{2 \times I \times (t_2 - t_1)}{V_{START\_t1+} + V_{END} - 2 \times V_{STOP}},$$

where I is the current value discharged through discharge circuit 108 when enabled, $t_2$–$t_1$ is the time during which discharge circuit 108 is enabled, $V_{START\_t1+}$ is the voltage at node $V_{ER}$ at time $t_1$ after discharge circuit 108 is enabled, $V_{STOP}$ is the voltage at node $V_{ER}$ at time $t_2$ after discharge circuit 108 is disabled and charge circuit 120 is enabled, and $V_{END}$ is the voltage at node $V_{ER}$ after charge circuit 120 is enabled and reserve capacitor 120 is recharged.

In circuit 200, the voltage at node $V_{ER}$ is measured when charge circuit 120 and discharge circuit 108 are disabled (i.e., no current is flowing through reserve capacitor 102) to obtain an accurate capacitance value measurement and avoid error contributions from equivalent series resistor 106. Thus, the charge and discharge timing must be carefully synchronized—challenging to do, and reserve capacitor 102 selectively chosen based on its electrical parameters to maximize differential voltage at times $t_2$ and $t_1$ and improve measurement accuracy.

The amount of current discharged through discharge circuit 108 must be well defined to compute the capacitance value ($C_{ER}$). Further, additional circuit components are required to accurately measure the current, which negatively affects the overall circuit footprint and increases energy consumption—in the form of wasted current through discharge circuit 108. At a minimum, a sequence of charge and discharge of reserve capacitor 102 is required for capacitance computation. For all these reasons, it is challenging to make an accurate measurement of capacitance using circuit 200.

Figure 3:
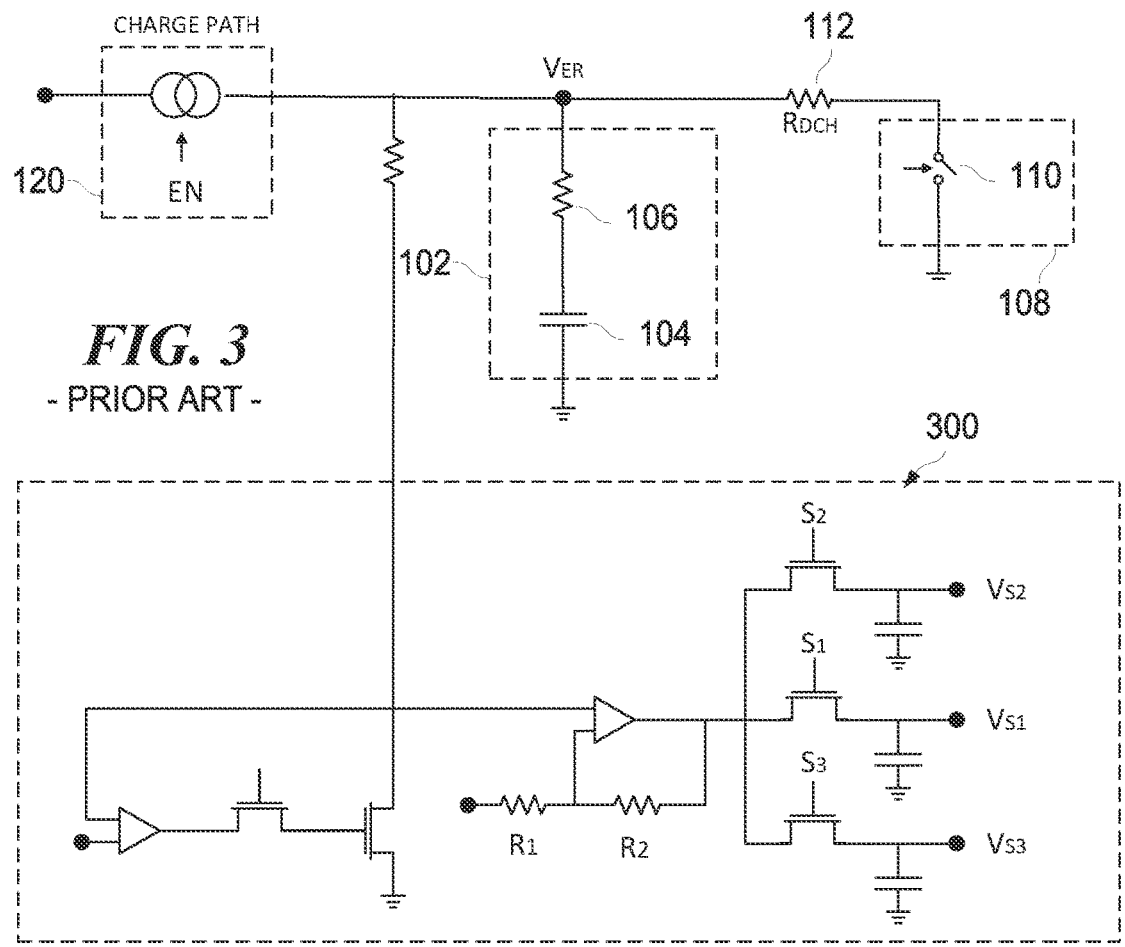
FIG. 3 is a prior art circuit used to measure an equivalent series resistor of a capacitor.

FIG. 3 illustrates a prior art circuit 300 used to measure the equivalent series resistor 106 of reserve capacitor 102. Circuit 300 includes multiple transistors and resistors, which are selectively enabled and disabled to measure equivalent series resistor 106. By enabling and disabling various switches (e.g., transistors) in various sequences and sampling the output of transistors S1, S2, and S3, the value ($R_{ESR}$) of the equivalent series resistor 106 can be computed using the equation:

$$R_{ESR} = \frac{((V_{S2} - V_{S1}) - (V_{S2} - V_{S3}))}{3 \times I}$$

where I is the current value discharged via discharge circuit 108 when enabled, $V_{S1}$ is the voltage sampled at the S1 transistor, $V_{S2}$ is the voltage sampled at the S2 transistor, and $V_{S3}$ is the voltage sampled at the S3 transistor. The sample voltages (i.e., $V_{S1}$, $V_{S2}$, and $V_{S3}$) are digitized through an analog-to-digital converter (not shown) coupled to the output of the sample/hold circuit.

Disadvantageously, circuit 300 requires at least a capacitor and switch for each sample that is to be held, which can significantly increase the footprint of circuit 300. Further, leakages at various switches can significantly undermine voltage drop measurement accuracy. Finally, errors inherent in the circuit used to measure the voltage across discharge resistor 112 can add additional errors in the computation of the value of equivalent series resistor 106.

Figure 4A:
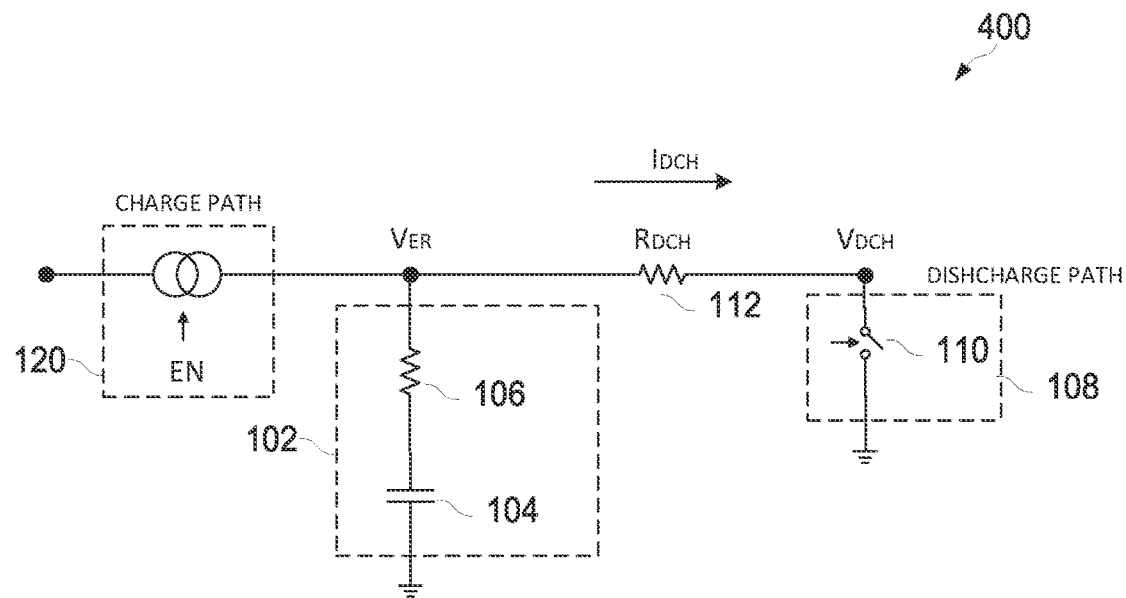
FIG. 4a is an embodiment circuit used to measure capacitance and equivalent series resistor values of a capacitor.

FIG. 4a illustrates an embodiment circuit 400 used to measure the capacitance and the equivalent series resistor values of reserve capacitor 102. The accurate measurement of these values allows circuit 400 to monitor the health of reserve capacitor 102. Circuit 400 simultaneously measures the capacitance and equivalent series resistor values of reserve capacitor 102 by enabling discharge circuit 108, measuring the voltage drop at node $V_{ER}$, and measuring the discharge current ($I_{DCH}$) flowing across the discharge resistor 112.

In embodiments, discharge resistor 112 is an existing resistor of an integrated circuit of an airbag system coupled to the reserve capacitor. In embodiments, discharge resistor 112 is sufficiently separated from circuit 400 to minimize an increase in temperature of circuit 400 while power is being dissipated through discharge resistor 112.

Figure 4B:
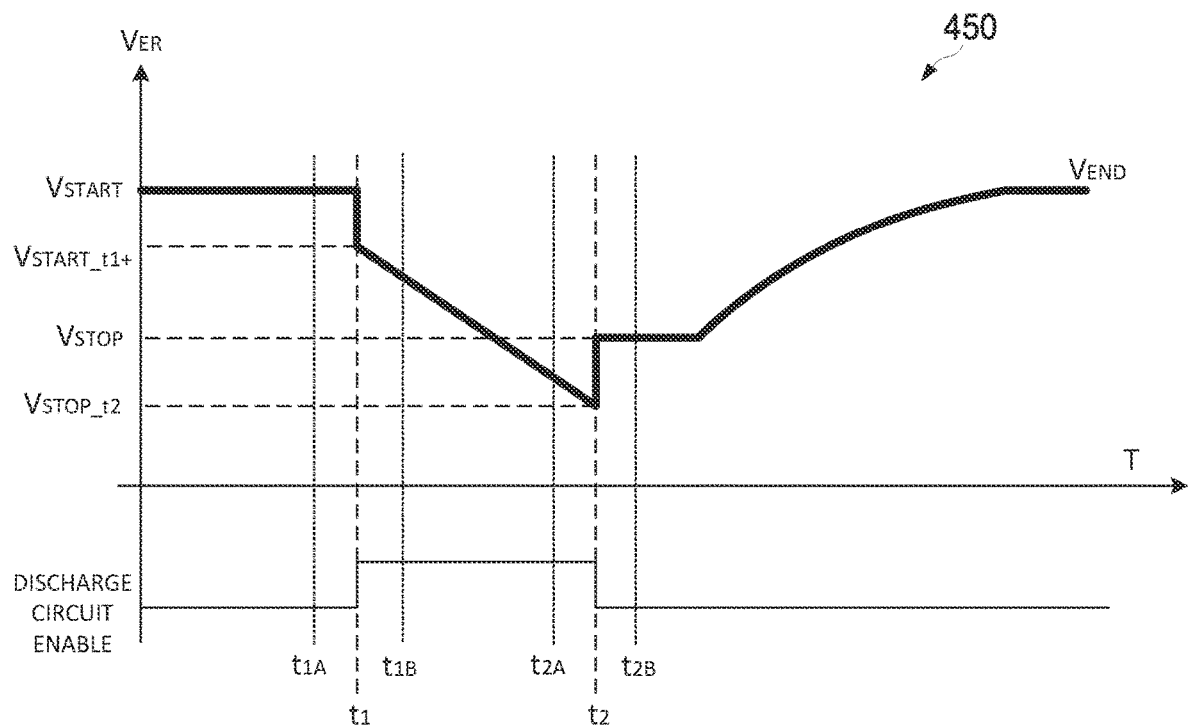
FIG. 4b is an embodiment timing diagram for the capacitor voltage.

FIG. 4b illustrates an embodiment timing diagram 450 for the $V_{ER}$ voltage during a discharge routine of reserve capacitor 102. Referring to circuit 400 and the timing diagram 450, the relationship between the capacitance value ($C_{ER}$) of reserve capacitor 102, the current (I(t)) flowing through discharge resistor 112 during a discharge routine (i.e., discharge circuit 108 enabled), and the voltage drop ($V_{START}$–$V_{STOP}$) from time $t_1$ (i.e., discharge circuit enabled) until time $t_2$ (i.e., discharge circuit 108 disabled) follows the equation:

$$C_{ER} = \frac{\int_{t_1}^{t_2} i(t)dt}{V_{START} - V_{STOP}}.$$

Reformulating the equation to replace the current I(t) flowing through discharge resistor 112 during the discharge routine (using Ohm's law), we have the following equation:

$$C_{ER} = \frac{\int_{t_1}^{t_2} [V_{ER}(t) - V_{DCH}(t)]dt}{V_{START} - V_{STOP}} \times \frac{1}{R_{DCH}},$$

where $R_{DCH}$ is the resistance value of discharge resistor 112.

Because the resistance value ($R_{DCH}$) of discharge resistor 112 is known, the values of $V_{START}$–$V_{STOP}$ and $\int_{t_1}^{t_2}[V_{ER}(t)-V_{DCH}(t)]dt$ allow the computation of the capacitance value ($C_{ER}$) value of reserve capacitor 102. Because the discharge current ($I_{DCH}$) is much larger than any leakage current at reserve capacitor 102, the leakage value can be excluded from the equation above with minimal errors-worst-case contributing error being less than 1%.

The equivalent series resistor value (ESR) of reserve capacitor 102 follows the equation:

$$ESR = \frac{(V_{START} - V_{START\_t1+}) + (V_{STOP} - V_{STOP\_t2-})}{I(t_1) + I(t_2)}.$$

Reformulating the equation to replace the current flowing through discharge resistor 112 during the discharge routine (using Ohm's law), we have the following equation:

$$ESR = R_{DCH} \times \frac{\Delta V_{START} + \Delta V_{STOP}}{[V_{ER}(t_1) - V_{DCH}(t_1)] + [V_{ER}(t_2) - V_{DCH}(t_2)]},$$

where $\Delta V_{START}$ is equal to $V_{START}$–$V_{START\_t1+}$, and where $\Delta V_{STOP}$ is equal to $V_{STOP}$–$V_{STOP\_t2-}$.

As shown in FIG. 4b, immediately after discharge circuit 108 is enabled at time $t_1$, the $V_{ER}$ voltage drops from $V_{START}$ to $V_{START\_t1+}$. The sharp drop is generally due to the non-zero equivalent series resistor value of reserve capacitor 102. The value of $V_{START}$ can be measured at any time before discharge circuit 108 is disabled. For example, the value of $V_{START}$ can be measured at time $t_{1A}$, which is about 64 microseconds before time $t_1$. The value of $V_{START\_t1+}$ can be measured after the discharge circuit 108 is enabled.

Optimally, the value of $V_{START\_t1+}$ is measured at time $t_1$. However, the measurement of $V_{START\_t1+}$ is likely to be completed between time $t_1$ and time $t_{1B}$ given the constraints of measurements systems. For example, a circuit that utilizes a sigma-delta type amplifier would measure the value of $V_{START\_t1+}$ between time $t_1$ and time $t_{1B}$—a period extending, for example, about 64 microseconds. It should be noted that the voltage measured towards time $t_{1B}$ is slightly lower than the value of $V_{START\_t1+}$. However, by setting $t_{1b}$ to a time close to time $t_1$, the voltage difference becomes negligible—particularly because the discharge at the reserve capacitor 102 is with a constant current sink. The resulting measurement of $V_{START\_t1+}$ is, thus, an average value of the voltage between time $t_1$ and time $t_{1B}$.

Further, as the discharge of the capacitor corresponds to a constant current, the discharge waveform being linear. It is preferred to take the measurement at time $t_1$ due to the time used by the sigma-delta to collect a sample—the measurement falling between time $t_1$ and $t_{1B}$ with the sigma-delta, which may cause a lower voltage than ideal to be measured. Similarly, it is preferred to take a measurement at time $t_2$ due to time used by the sigma-delta to acquire a sample—the measurement falling between time $t_{2a}$ and time $t_2$ with the sigma-delta, which may cause a higher voltage higher than ideal to be measured. However, the average between the two measurements by the sigma-delta provides an identical measurement to the ideal condition due to consistencies with the measurement time by the sigma-delta and the linear form of the discharge waveform.

It is noted that the approximate 64 microseconds associated with the timing of the measurements corresponds to an operation of an exemplary sigma-delta type amplifier and is not limiting.

In an embodiment, the various components of circuit 400 are synchronized using a clock signal. Thus, the various voltage measurements can be performed with sufficient accuracy to time the measurement of values $V_{START}$ and $V_{START\_t1+}$, for example, 64 microseconds before and after the enabling of discharge circuit 108.

In another embodiment, the difference between $V_{START}$ and $V_{START\_t1+}$ is measured by monitoring the slope (change in voltage at $V_{ER}$ node in reference to time). As shown, the slope at time $t_1$ (i.e., sharp drop) is different from the slope between times $t_1$ and $t_2$ (i.e., linear, gradual drop). By continuously monitoring $V_{ER}$ over time, the difference between $V_{START}$ and $V_{START\_t1+}$ is set to the value before the occurrence of the change in slope.

Similarly and as shown in FIG. 4b, immediately after the discharge circuit 108 is disabled at time $t_2$, the VER voltage jumps from $V_{STOP\_t2-}$ to $V_{STOP}$. As before, the sharp change in voltage is generally due to the non-zero equivalent series resistor value of reserve capacitor 102. The value of $V_{STOP}$ can be measured after discharge circuit 108 is disabled, and before charge circuit 120 is enabled. For example, the value of $V_{STOP}$ can be measured at time $t_{2B}$, which is about 64 microseconds after time $t_2$. The value of $V_{STOP\_t2-}$ is measured before discharge circuit 108 is disabled. For example, the value of $V_{STOP\_t2-}$ can be measured at time $t_{1A}$, which is about 64 microseconds before time $t_2$. It should be noted that the voltage measured at time $t_{2A}$ is slightly higher than the value of $V_{STOP\_t2-}$. However, by setting $t_{2A}$ to a time close to time $t_1$, the difference in voltage becomes negligible.

In an embodiment, the various components of circuit 400 are synchronized using a clock signal. Thus, the various voltage measurements can be performed with sufficient accuracy to time the measurement of values $V_{STOP\_t2-}$ and $V_{STOP}$, for example, in reference to the time corresponding to the disabling of discharge circuit 108.

In another embodiment, the difference between $V_{STOP\_t2-}$ and $V_{STOP}$ is measured by monitoring the slope (change in voltage at $V_{ER}$ node in reference to time). As shown, the slope between times $t_1$ and $t_2$ (i.e., linear, gradual drop), the slope at time $t_2$ (i.e., sharp jump), and the slope after time $t_2$ (i.e., steady) are different in value. By continuously monitoring $V_{ER}$ over time, the difference between $V_{STOP\_t2-}$ and $V_{STOP}$ is set to the boundary values corresponding to the change from time $t_1$ to $t_2$ and after time $t_2$.

Because the resistance value ($R_{DCH}$) of the discharge resistor 112 is known, the values of $\Delta V_{START}$, $\Delta V_{STOP}$, $V_{ER}(t_1)-V_{DCH}(t_1)$, and $V_{ER}(t_2)-V_{DCH}(t_2)$ allow the computation of the equivalent series resistor (ESR) value of reserve capacitor 102.

In embodiments, the capacitance value of the reserve capacitor 102 is between 2.2 milliFarads (mF) and 52 mF, the equivalent series resistor value of reserve capacitor 102 is between 0.2 Ohms and 0.6 Ohms, the resistor value of discharge resistor 112 is approximately 20 Ohms, the voltage at node $V_{ER}$ is between 20 and 33 volts, and the discharge current ($I_{DCH}$) flowing through discharge resistor 112 during a discharge routine is between 1 amp to 1.65 amps—in comparison, the leakage at the reserve capacitor 102 is minimal (e.g., 10 mA). The drop in $V_{ER}$ voltage ($V_{START\_t1+}-V_{STOP\_t2-}$) from time $t_1$ to time $t_2$ is approximately 0.5 Volts in an embodiment.

Figure 5:
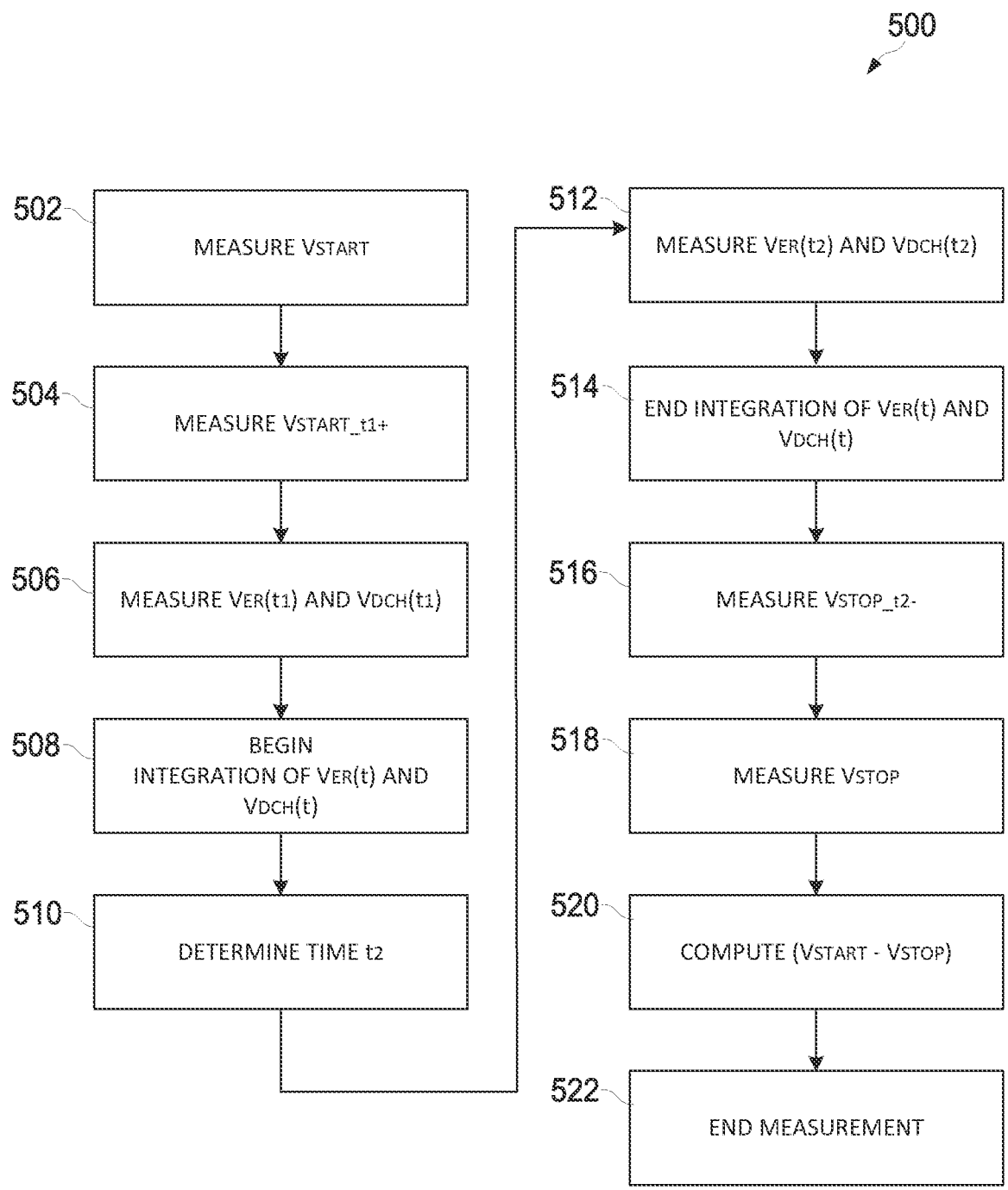
FIG. 5 is a flowchart of an embodiment method for measuring the values for the various parameters used to calculate capacitance and equivalent series resistor values of a capacitor.

FIG. 5 is a flowchart of an embodiment method 500 for measuring the values for the various parameters: $V_{START}$, $V_{STOP}$, $\int_{t_1}^{t_2}[V_{ER}(t)-V_{DCH}(t)]dt$, $\Delta V_{START}$, $\Delta V_{STOP}$, $V_{ER}(t_1)-V_{DCH}(t_1)$, and $V_{ER}(t_2)-V_{DCH}(t_2)$. These parameter values, once measured, can be used to compute the capacitance ($C_{ER}$) and the equivalent series resistor (ESR) values of reserve capacitor 102.

At step 502 and before time $t_1$, the steady-state voltage value $V_{START}$ at node $V_{ER}$ is measured. At step 504, discharge circuit 108 is enabled, and reserve capacitor 102 begins discharging. As soon as discharge circuit 108 is enabled at time $t_1$, the voltage value $V_{START\_t1+}$ at node $V_{ER}$ is measured. The difference between the voltages measured at node $V_{ER}$ at step 502 (e.g., $V_{START}$) and at step 504 (e.g., $V_{START\_t1+}$) provides the value for the parameter $\Delta V_{START}$.

At step 506 at time $t_1$, the voltages at nodes $V_{ER}$ and $V_{DCH}$ are measured to compute the value corresponding to the parameter $V_{ER}(t_1)-V_{DCH}(t_1)$.

At step 508, the integration $\int_{t_1}^{t_2}[V_{ER}(t)-V_{DCH}(t)]dt$ begins at time $t_1$.

At step 510, time $t_2$ is determined corresponding to a voltage drop at node $V_{ER}$ being greater than or equal to a threshold voltage (e.g., 1.2 volts). In embodiments, the voltage at node VER is continuously monitored and subtracted from the steady-state voltage value $VS_{TART}$ until the threshold voltage is reached.

At step 512 and at time $t_2$, the voltages at nodes $V_{ER}$ and $V_{DCH}$ are again measured to compute the value corresponding to the parameter $V_{ER}(t_2)-V_{DCH}(t_2)$. At step 514, the integration $\int_{t_1}^{t_2}[V_{ER}(t)-V_{DCH}(t)]dt$ ends at time $t_2$.

At step 516 and at time $t_2$, the voltage value $V_{STOP\_t2-}$ at node $V_{ER}$ is measured. At step 518, discharge circuit 108 is disabled, and charge circuit 120 is enabled. As soon as charge circuit 120 is enabled, the voltage value $V_{STOP}$ at node $V_{ER}$ is measured. The difference between the voltages measured at node $V_{ER}$ at step 518 (e.g., $V_{STOP}$) and at step 516 (e.g., $V_{STOP\_t2-}$) provides the value for the parameter $\Delta V_{STOP}$.

At step 520, the difference in voltage measured at node VER at step 518 (e.g., $V_{STOP}$) and at step 502 (e.g., $V_{START}$) provides the value for the parameter $V_{START}-V_{STOP}$. At step 522, the measurement sequence ends.

In embodiments, if the computed values for the capacitance ($C_{ER}$) and the equivalent series resistor (ESR) of reserve capacitor 102 falls outside a corresponding threshold value, an error signal is generated from a microcontroller circuit of the supplemental restraint system (SRS) to the vehicle computer. The error signal alerts the driver that the reserve capacitor of the supplemental restraint system (SRS) is outside of the normal operating range and that the system requires service.

It is noted that the order of steps shown in FIG. 5 is not absolutely required, so in principle, the various steps may be performed out of the illustrated order. Also, certain steps may be skipped, different steps may be added or substituted, or selected steps or groups of steps may be performed in a separate application.

Figure 6:
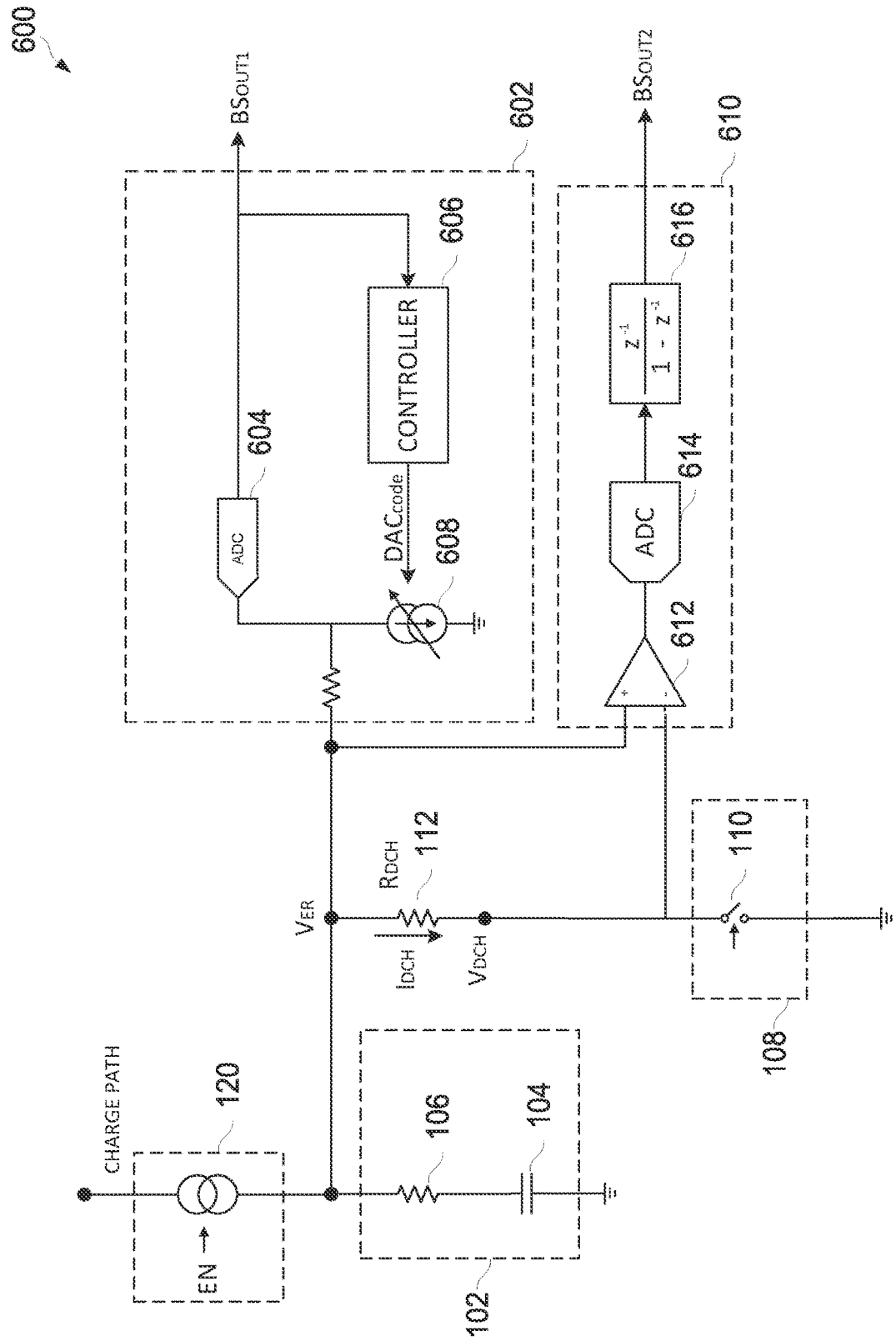
FIG. 6 is a diagram of an embodiment circuit used to measure the values for the various parameters used to calculate capacitance and equivalent series resistor values of a capacitor.

FIG. 6 illustrates a diagram of an embodiment circuit 600 used to measure the values for the various parameters: $V_{START}-V_{STOP}$, $\int_{t_1}^{t_2} [V_{ER}(t)-V_{DCH}(t)]dt$, $\Delta V_{START}$, $\Delta V_{STOP}$, $V_{ER}(t_1)-V_{DCH}(t_1)$, and $V_{ER}(t_2)-V_{DCH}(t_2)$ to compute the capacitance ($C_{ER}$) and the equivalent series resistor (ESR) values of reserve capacitor 102.

As shown, circuit 600, in addition to the components previously described with respect to circuit 400, includes first circuitry 602 and second circuitry 610. First circuitry 602 includes a sigma-delta ($\Sigma$-$\Delta$) analog-to-digital converter 604, a controller, and a controllable current sink 608. The input of the first circuitry 602 is coupled to the $V_{ER}$ node, and the output of the first circuitry 602 is the digital signal $BS_{OUT2}$.

Second circuitry 610 includes an amplifier 612, a differential sigma-delta ($\Sigma$-$\Delta$) analog-to-digital converter 614, and a digital integrator 616. The input of the second circuitry 610 is coupled to the $V_{ER}$ and $V_{DCH}$ nodes at the terminals of discharge resistor 112 ($R_{DCH}$). The output of the second circuitry 610 is the digital signal $BS_{OUT2}$.

Parameters $V_{START}-V_{STOP}$, $\Delta V_{START}$, and $\Delta V_{STOP}$ are computed using the first circuitry 602, which is optimized to measure voltage variations at the $V_{ER}$ node. The digital output signal ($BS_{OUT1}$) is filtered and computed by a logic circuit (not shown) coupled to the output of the first circuitry 602.

Parameters $\int_{t_1}^{t_2}[V_{ER}(t)-V_{DCH}(t)]dt$, $V_{ER}(t_1)-V_{DCH}(t_1)$, and $V_{ER}(t_2)-V_{DCH}(t_2)$ are computed using the second circuitry 610. The digital output signal ($BS_{OUT2}$) is filtered and computed by a logic circuit (not shown) coupled to the output of the second circuitry 610.

Once the value for parameters $V_{START}-V_{STOP}$, $\Delta V_{START}$, $\Delta V_{STOP}$, $\int_{t_1}^{t_2}[V_{ER}(t)-V_{DCH}(t)]dt$, $V_{ER}(t_1)-V_{DCH}(t_1)$, and $V_{ER}(t_2)-V_{DCH}(t_2)$ are computed, a logic circuit or a processor computes the capacitance ($C_{ER}$) and the equivalent series resistor (ESR) values of reserve capacitor 102 using the equations:

$$ESR = R_{DEC} \times \frac{\Delta V_{START} + \Delta V_{STOP}}{[V_{ER}(t_1) - V_{DCH}(t_1)] + [V_{ER}(t_2) - V_{DCH}(t_2)]}.$$

Embodiments of this disclosure advantageously limit the computation of the capacitance ($C_{ER}$) and the equivalent series resistor (ESR) values to a single discharge routine. As such, the amount of dissipation to make the various measurements, in contrast to the prior art, is advantageously minimized.

In embodiments, circuit 600 is embedded in the supplemental restraint system (SRS) and is self-managed. As soon as a capacitive measurement is requested, the embodiments of this disclosure provide a limited discharge voltage at the $V_{ER}$ node with a fast execution time (e.g., single discharge phase).

It is noted that the various measurements are a function of the discharge current ($I_{DCH}$) sunk through discharge circuit 108. Discharge switch 110 operates in the linear region in a low-power dissipation mode. The use of discharge circuit 108 to measure the various parameters, advantageously, is a repurposing of existing components within the supplemental restraint system (SRS). As such, the number of components to measure the various parameters is minimized.

Unless otherwise specified, when reference is made to two elements electrically connected together, this means that the elements are directly connected with no intermediate element other than conductors. When reference is made to two elements electrically coupled together, this means that the two elements may be directly coupled (connected) or coupled via one or a plurality of other elements.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A method for measuring a capacitance value of a capacitor, the method comprising:
   having a resistor coupled to a terminal of the capacitor;
   measuring a difference in voltage at the terminal between a first time and a second time during a discharge routine of the capacitor, the discharge routine comprising sinking a current through a discharge circuit coupled to the resistor from the first time to the second time;
   measuring an integration of a difference in voltage at terminals of the resistor during the discharge routine between the first time and the second time;

computing the capacitance value based on the measured difference in voltage, the measured integration, and an inverse of a resistance value of the resistor; and determining a health of the capacitor based on a difference between the computed capacitance value and a threshold value.

2. The method of claim 1, further comprising determining the second time by monitoring the voltage at the terminal during the discharge routine, the second time corresponding to a difference in voltage at the terminal, between the first time and the second time, being greater than or equal to a second threshold voltage.

3. The method of claim 2, wherein a value of the second threshold voltage is 1.2 volts, and wherein a steady-state voltage at the capacitor is between 20 and 33 volts.

4. The method of claim 1, wherein the capacitor is a reserve capacitor in a supplemental restraint system of a vehicle.

5. The method of claim 1, wherein the capacitance value is computed using equation:

$$C_{ER} = \frac{\int_{t_1}^{t_2} [V_{ER}(t) - V_{DCH}(t)]dt}{V_{START} - V_{STOP}} \times \frac{1}{R_{DCH}},$$

wherein $R_{DCH}$ is the resistance value of the resistor, $V_{ER}$ is the voltage at the terminal, $V_{DCH}$ is a voltage at a second terminal of the resistor coupled to the discharge circuit, $t_1$ is the first time, $t_2$ is the second time, $V_{start}$ is a steady-voltage at the terminal before the discharge circuit is enabled, and $V_{stop}$ is a voltage at the terminal after the discharge circuit is disabled.

6. A system for measuring a voltage drop of a reserve capacitor in a supplemental restraint system (SRS), the reserve capacitor having a capacitance value and an equivalent series resistor value, the system comprising:

a resistor having a first terminal and a second terminal, the first terminal of the resistor coupled to a terminal of the reserve capacitor;

a discharge circuit coupled to the second terminal of the resistor, the discharge circuit configured to supply a discharge path for the reserve capacitor during a discharge routine; and circuitry configured to:
measure a first change in voltage at the first terminal between a first time and a second time during a discharge routine of the reserve capacitor, the discharge routine comprising sinking a current through a discharge circuit coupled to the resistor from the first time to the second time, measure an integration of a first change in voltage at the terminals of the resistor during the discharge routine between the first time and the second time, measure a second change in voltage at the first terminal at the first time, measure a first change in voltage across terminals of the resistor at the first time, measure a second change in voltage across the terminals of the resistor at the second time, measure a third change in voltage at the first terminal at the second time, compute the capacitance value based on the measured first change in voltage at the first terminal, the measured integration, and an inverse of a resistance value of the resistor, and determine a health of the reserve capacitor based on a difference between the computed capacitance value and a threshold value.

7. The system of claim 6, wherein the capacitance value is computed using equation:

$$C_{ER} = \frac{\int_{t_1}^{t_2} [V_{ER}(t) - V_{DCH}(t)]dt}{V_{START} - V_{STOP}} \times \frac{1}{R_{DCH}},$$

wherein $R_{DCH}$ is a resistance value of the resistor, $V_{ER}$ is the voltage at the terminal, $V_{DCH}$ is a voltage at a second terminal of the resistor coupled to the discharge circuit, $t_1$ is the first time, $t_2$ is the second time, $V_{start}$ is a steady-voltage at the terminal before the discharge circuit is enabled, and $V_{stop}$ is a voltage at the terminal after the discharge circuit is disabled.

8. The system of claim 6, further comprising a logic circuit configured to:

compute the equivalent series resistor value based on the measured second and third change in voltage at the first terminal and the first and second change in voltage across terminals of the resistor; and determine the health of the reserve capacitor based on a difference between the computed equivalent series resistor value and a threshold value.

9. The system of claim 6, wherein the second time corresponds to a difference in voltage at the first terminal, between the first time and the second time, being greater than or equal to a second threshold voltage.

10. The system of claim 6, wherein measuring the second change in voltage at the first terminal comprises measuring a change in voltage at the first terminal during a steady-state condition and a third time, wherein the steady-state condition corresponds to a time before enabling of the discharge circuit at the first time, and wherein the third time is a time corresponding to a first change in slope of the voltage at the terminal during the discharge routine.

11. The system of claim 6, wherein measuring the third change in voltage at the first terminal at the second time comprises measuring a difference in voltage at the first terminal during a third time and a fourth time, wherein the third time is a time corresponding to a second change in slope of the voltage at the terminal during the discharge routine, and wherein the fourth time is a time corresponding to a third change in slope of the voltage at the terminal, the third change in slope being after the discharge circuit is disabled.

12. The system of claim 8, wherein the equivalent series resistor value is computed using equation:

$$ESR = R_{DCH} \times \frac{\Delta V_{START} + \Delta V_{STOP}}{[V_{ER}(t_1) - V_{DCH}(t_1)] + [V_{ER}(t_2) - V_{DCH}(t_2)]},$$

wherein $R_{DCH}$ is a resistance value of the resistor, $V_{ER}$ is a voltage at the first terminal, $V_{DCH}$ is a voltage at the second terminal, $t_1$ is the first time, $t_2$ is the second time, $\Delta V_{START}$ is the second change in voltage at the first terminal, and $\Delta V_{STOP}$ is the third change in voltage at the first terminal.

13. The system of claim 9, wherein a value of the second threshold voltage is 1.2 volts, and wherein a steady-state voltage at the reserve capacitor is between 20 and 33 volts.

14. A circuit for measuring a voltage drop of a reserve capacitor having a capacitance value and an equivalent series resistor value, the system comprising:
   a discharge circuit couplable to a first terminal of a resistor, the discharge circuit configured to supply a discharge path for the reserve capacitor during a discharge routine, a second terminal of the resistor couplable to a terminal of the reserve capacitor; and
   circuitry configured to:
      measure a difference in voltage at the terminal between a first time and a second time during a discharge routine of the reserve capacitor, the discharge routine comprising sinking a current through the discharge circuit from the first time to the second time;
      measure an integration of a difference in voltage at terminals of the resistor during the discharge routine between the first time and the second time;
      compute the capacitance value based on the measured difference in voltage, the measured integration, and an inverse of a resistance value of the resistor; and
      determine a health of the reserve capacitor based on a difference between the computed capacitance value and a threshold value.

15. The circuit of claim 14, wherein the circuitry is configured to determine the second time by monitoring the voltage at the terminal during the discharge routine, the second time corresponding to a difference in voltage at the terminal, between the first time and the second time, being greater than or equal to a second threshold voltage.

16. The circuit of claim 14, wherein the reserve capacitor is a capacitor in a supplemental restraint system (SRS) of a vehicle.

17. The circuit of claim 14, wherein the capacitance value is computed using equation:

$$C_{ER} = \frac{\int_{t_1}^{t_2} [V_{ER}(t) - V_{DCH}(t)]dt}{V_{START} - V_{STOP}} \times \frac{1}{R_{DCH}},$$

wherein RDCH is the resistance value of the resistor, VER is the voltage at the terminal, VDCH is a voltage at a second terminal of the resistor coupled to the discharge circuit, $t_1$ is the first time, $t_2$ is the second time, Vstart is a steady-voltage at the terminal before the discharge circuit is enabled, and Vstop is a voltage at the terminal after the discharge circuit is disabled.

18. The circuit of claim 14, wherein the circuitry is configured to:
   measure a second change in voltage across the terminals of the resistor at the second time;
   measure a third change in voltage at the first terminal at the second time;
   compute the equivalent series resistor value based on the measured second and third change in voltage at the first terminal and the first and second change in voltage across terminals of the resistor; and
   determine the health of the reserve capacitor based on a difference between the computed equivalent series resistor value and a threshold value.

19. The circuit of claim 15, wherein a value of the second threshold voltage is 1.2 volts, and wherein a steady-state voltage at the reserve capacitor is between 20 and 33 volts.

20. The circuit of claim 17, wherein the steady-state condition corresponds to a time before enabling of the discharge circuit at the first time.

* * * * *